United States Patent
Tojyo et al.

(10) Patent No.: US 6,529,101 B2
(45) Date of Patent: Mar. 4, 2003

(54) MULTILAYERED LC FILTER

(75) Inventors: Atsushi Tojyo, Shiga-ken (JP); Noboru Kato, Moriyama (JP)

(73) Assignee: Murata Manufacturing Co., Ltd.

( * ) Notice: Subject to any disclaimer, the term of this patent is extended or adjusted under 35 U.S.C. 154(b) by 0 days.

(21) Appl. No.: 09/935,506

(22) Filed: Aug. 23, 2001

(65) Prior Publication Data

US 2002/0063611 A1 May 30, 2002

(30) Foreign Application Priority Data

Nov. 29, 2000 (JP) .................................... 2000-363220

(51) Int. Cl.[7] ................................................. H03H 7/09
(52) U.S. Cl. .................... 333/175; 333/185; 333/177
(58) Field of Search .............................. 333/175, 177, 333/178, 184, 185, 204

(56) References Cited

U.S. PATENT DOCUMENTS 5,404,118 A * 4/1995 Okamura et al. .......... 333/175
5,608,364 A * 3/1997 Hirai et al. ................ 333/185
5,945,862 A * 8/1999 Kato et al. ................. 333/185

FOREIGN PATENT DOCUMENTS

| JP | 08-335803 | | 12/1996 |
| JP | 09-035936 | | 2/1997 |
| JP | 09205018 A | * | 8/1997 |
| JP | 11251856 A | * | 9/1999 |

* cited by examiner

Primary Examiner—Seungsook Ham
(74) Attorney, Agent, or Firm—Keating & Bennett, LLP

(57) ABSTRACT

A multi-layered LC filter includes a plurality of insulating sheets stacked on each other and inductor via holes that are connected to each other in a stacking direction of insulating sheets, forming two columnar inductors. First ends of the inductors are connected to external ground electrodes via internal ground patterns, respectively. The external ground electrodes are electrically connected via a bridge pattern disposed in proximity to the inductors, allowing adjustment of the value of the magnetic coupling between LC resonators without changing the size of the filter.

20 Claims, 5 Drawing Sheets

MULTILAYERED LC FILTER

BACKGROUND OF THE INVENTION

1. Field of the Invention

The present invention relates to multilayered LC filters, and more specifically, to a multilayered LC filter for use in a mobile communication devices such as a cellular phone.

2. Description of the Related Art

As an example of such a multilayered LC filter, FIG. 8 shows the construction of a conventional multilayered LC filter 1. The multilayered LC filter 1 includes a laminated body 2 composed of laminated insulating sheets, and within the laminated body 2, inductors L1 and L2 defined by inductor via holes provided in ceramic sheets and connected to each other, and capacitors C1 and C2 that are defined by hot-side capacitor patterns 3 and 4 and a ground-side capacitor pattern 7.

One end of the inductor L1 is electrically connected to an external ground electrode G1 via an internal ground pattern 5, and the other end thereof is electrically connected to the hot-side capacitor pattern 3. Similarly, one end of the inductor L2 is electrically connected to an external ground electrode G2, provided on the surface of the laminated body 2, via an internal ground pattern 6, and the other end thereof is electrically connected to the hot-side capacitor pattern 4. The hot-side capacitor patterns 3 and 4 are electrically connected respectively to an external input electrode and an external output electrode (not shown) provided on the surface of the laminated body 2.

In the multilayered LC filter 1, the inductor L1 and the capacitor C1 define an LC resonator Q1. Similarly, the inductor L2 and the capacitor C2 define an LC resonator Q2. Because the internal ground patterns 5 and 6 are electrically separated, the ground sides of the two LC resonators Q1 and Q2 are not combine-coupled, but instead are electrically independent of each other. Thus, the coupling between the resonators Q1 and Q2 is capacitive and weak, with the value of the equivalent magnetic coupling being 0.1 or smaller.

As another example, FIG. 9 shows the construction of another conventional multilayered LC filter 11. The multilayered LC filter 11 includes a laminated body 12 including laminated ceramic sheets, and within the laminated body 12, inductors L1 and L2 are defined by inductor via holes provided on insulating sheets and connected to each other, and capacitors C1 and C2 are defined by hot-side capacitor patterns 13 and 14 and a ground-side capacitor pattern 16.

First ends of the inductor L1 and the inductor L2 are electrically connected respectively to external ground electrodes G1 and G2 via an internal ground pattern 15, and second ends thereof are electrically connected respectively to the hot-side capacitor patterns 13 and 14. The hot-side capacitor patterns 13 and 14 are electrically connected respectively to an external input electrode and an external output electrode (not shown) provided on the surface of the laminated body 12.

In the multilayered LC filter 11, the inductor L1 and the capacitor C1 define an LC resonator Q1. Similarly, the inductor L2 and the capacitor C2 define an LC resonator Q2. The ground sides of the two resonators Q1 and Q2 are combine-coupled via an internal ground pattern 15, thus being electrically short-circuited. Thus, the coupling between the LC resonators Q1 and Q2 is inductive and strong, with the value of the equivalent magnetic coupling being 0.2 or larger.

However, although the conventional multilayered LC filters 1 and 11 can provide a value of the magnetic coupling between the LC resonators Q1 and Q2 of 0.1 or smaller, or 0.2 or larger, they fail to provide a value of the magnetic coupling between 0.1 and 0.2. It is known that, for example, in the multilayered LC filter 1 shown in FIG. 8, the value of the magnetic coupling between the LC resonators Q1 and Q2 can be adjusted by changing the distance between the inductors L1 and L2. However, this method of adjusting the value of the magnetic coupling by changing the distance between the inductors L1 and L2 does not allow for selecting an arbitrary value of the magnetic coupling due to restrictions of the product size, and other limitations. For example, the distance between the inductors L1 and L2 may be shortened to a certain extent to adjust the value of the magnetic coupling between the LC resonators Q1 and Q2. However, when the inductors L1 and L2 come too close to each other, problems may occur in the manufacturing process. For example, the ceramic material between the inductors L1 and L2 may crack at the time of firing.

SUMMARY OF THE INVENTION

In order to overcome the problems described above, preferred embodiments of the present invention provide a multi-layered LC filter which allows adjustment of the value of the magnetic coupling between LC resonators without changing the size of the filter.

According to a preferred embodiment of the present invention, a multi-layered LC filter includes a laminated body having a plurality of insulating layers that are stacked on each other. In the laminated body, a plurality of LC resonators including a plurality of inductors and a plurality of capacitors is provided. The multi-layered LC filter includes a plurality of via holes connected to each other in the lamination or stacking direction of the plurality of insulating layers, and a plurality of external ground electrodes provided on a surface of the laminated body, to which first ends of the plurality of inductors are electrically connected individually, and a bridge pattern disposed on a surface of one of the plurality of insulating layers and in proximity to the plurality of inductors, electrically connecting the plurality of external ground electrodes.

In accordance with another preferred embodiment of the present invention, a multi-layered LC filter includes a laminated body having a plurality of insulating layers stacked on each other. In the laminated body, a plurality of LC resonators having a plurality of inductors and a plurality of capacitors is provided. The multi-layered LC filter includes a first insulating layer on which segmented internal ground patterns are provided, a second insulating layer on which a plurality of inductor via holes and a bridge pattern in proximity to the plurality of inductor via holes are provided, a third insulating layer on which a plurality of inductor via holes is provided, a fourth insulating layer on which a plurality of hot-side capacitor patterns is provided, a fifth insulating layer on which a ground-side capacitor pattern is provided opposing the plurality of hot-side capacitor patterns, so as to form the plurality of capacitors of the plurality of LC resonators, and an external input electrode, an external output electrode, and a plurality of external ground electrodes provided on a surface of the laminated body which includes first to fifth insulating layers laminated. In the multilayered LC filter, the plurality of inductor via holes provided in the second insulating layer and the plurality of inductor via holes provided in the third insulating layer are connected to each other in the lamination direction of the plurality of insulating layers. First ends of the plurality of inductors are electrically connected to the plurality of hot-side capacitor patterns of the plurality of capacitors, and second ends thereof are electrically connected to the plurality of external ground electrodes via the internal ground patterns provided on the first insulating layer. The ends of the bridge pattern provided on the second insulating layer are electrically connected respectively to the plurality of external ground electrodes, and the bridge pattern is disposed in proximity to the plurality of inductors including the plurality of via holes.

The plurality of inductors primarily includes the plurality of via holes connected with each other. Although, for example, the internal ground patterns have respective inductive elements, the primary inductive elements of the inductors are associated with the plurality of via holes. The via holes are arranged to function as inductors when represented in terms of an equivalent circuit.

The bridge pattern electrically connecting the plurality of external ground electrodes is disposed in proximity to the plurality of inductors including the plurality of via holes, so that the value of the equivalent magnetic coupling between the plurality of LC resonators can be adjusted by changing the position of the bridge pattern. If the bridge pattern is disposed between the ends of each of the plurality of inductors in the lamination or stacking direction of the plurality of insulating layers, the value of the magnetic coupling between the plurality of LC resonators becomes larger than about 0.1 and smaller than about 0.2. That is, the value of the magnetic coupling between the plurality of LC resonators is larger than that in the case where the LC resonators are inductively coupled, and larger than that in the case where the LC resonators are capacitively coupled.

According to preferred embodiments of the present invention, the bridge pattern electrically connecting the plurality of external electrodes is preferably disposed in proximity to the plurality of inductors, so that the value of the equivalent magnetic coupling between the plurality of LC resonators can be adjusted by changing the position of the bridge pattern without changing the size of the filter.

Other features, elements, characteristics and advantages of the present invention will become more apparent from the detailed description of preferred embodiments with reference to the attached drawings.

DETAILED DESCRIPTION OF PREFERRED EMBODIMENTS

Figure 1:
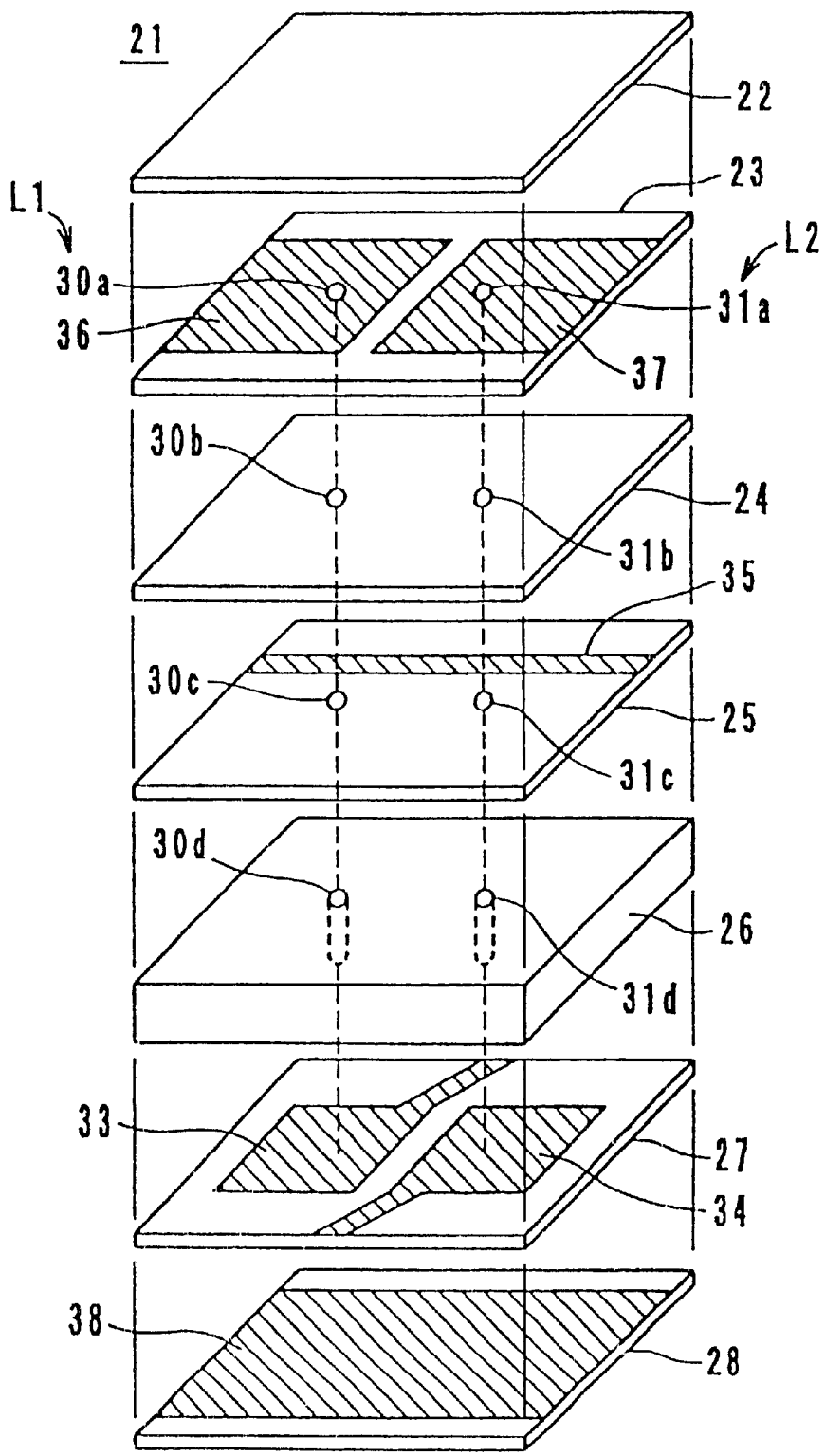
FIG. 1 is an exploded perspective view of a multilayered LC filter according to a preferred embodiment of the present invention.
Figure 2:
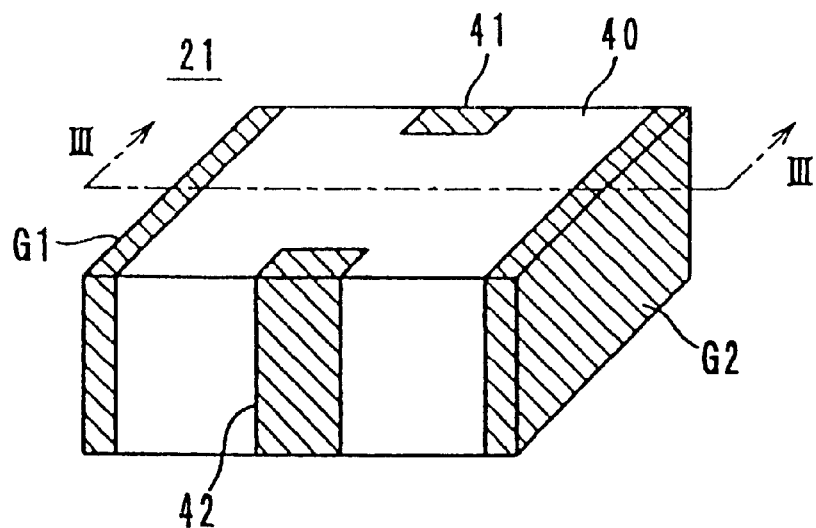
FIG. 2 is an external perspective view of the multilayered LC filter shown in FIG. 1.
Figure 3:
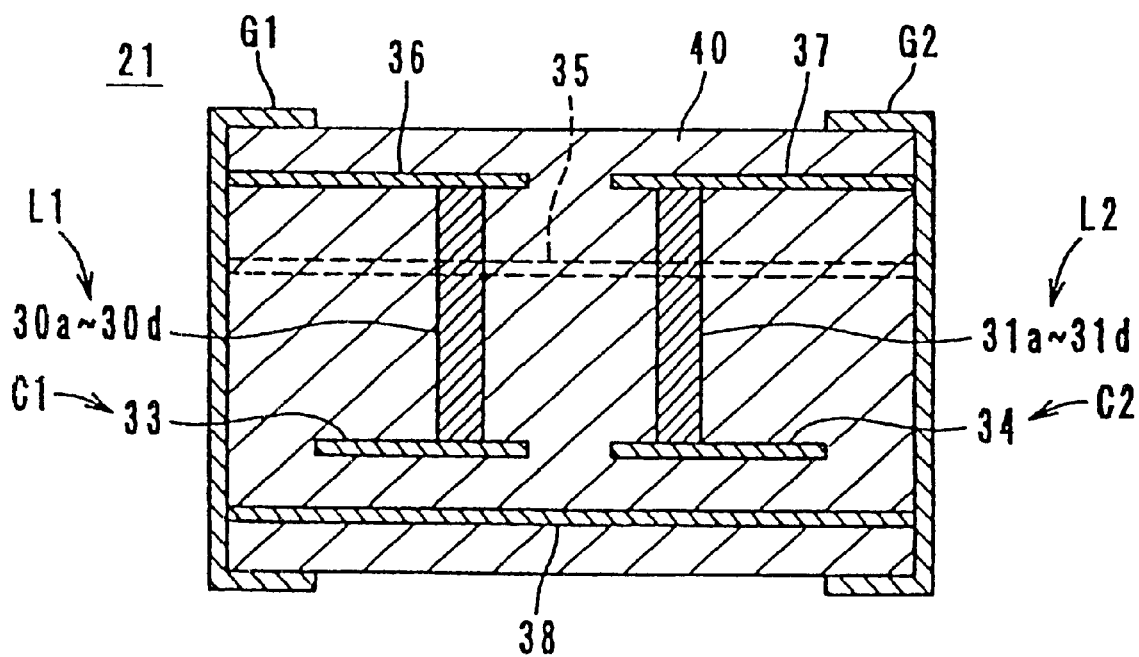
FIG. 3 is a sectional view taken along the line III—III in FIG. 2.

A multi-layered LC filter according to a preferred embodiment of the present invention will be described below with reference to the accompanying drawings. FIG. 1 is an exploded perspective view of a multilayered LC filter 21, and FIGS. 2 and 3 are an external perspective view and a sectional view of the multilayered LC filter 21, respectively.

As shown in FIG. 1, the multilayered LC filter 21 includes insulating sheets 22 to 28 on which inductor via holes 30a to 30d and 31a to 31d, hot-side capacitor patterns 33 and 34, a bridge pattern 35, internal ground patterns 36 and 37, and a ground-side capacitor pattern 38 are provided. The insulating sheets 22 to 28 are preferably made of dielectric ceramic powders or magnetic ceramic powders kneaded with a bonding agent, or other suitable material. The patterns 33 to 38 are preferably made of Ag, Pd, Cu, Ni, Au, Ag—Pd, or other suitable material, and are formed, for example, by printing or other suitable method.

The inductor via holes 30a to 30d and 31a to 31d are respectively connected in the lamination direction of the insulating sheets 22 to 28, substantially forming the columnar inductors L1 and L2 with a length of about $\lambda/4$ (wherein $\lambda$ is the wavelength at the center frequency). That is, the inductors L1 and L2 are constituted primarily of the via holes 30a to 30d and 31a to 31d connected with one another, respectively. For example, the internal ground patterns 36 and 37 also have their inductive elements, although the primary inductive elements of the inductors L1 and L2 are associated with the via holes 30a to 30d and 31a to 31d. The via holes 30a to 30d and 31a to 31d are constructed to function as inductors when represented in terms of an equivalent circuit.

The direction of the axes of the inductors L1 and L2 is substantially perpendicular to the surfaces of the sheets 22 to 28. When current flows through the inductors L1 and L2, magnetic fields which circulate on the planes that are substantially perpendicular to the axial direction of the inductors L1 and L2 are generated. One end of each of the inductors L1 and L2 (i.e., the via holes 30a and 31a) is connected to the internal ground patterns 36 and 37, respectively. The other end of each of the inductors L1 and L2 (i.e., the via holes 30d and 31d) is connected to the hot-side capacitor patterns 33 and 34, respectively.

The inductor via holes 30a to 30d and 31a to 31d are formed by creating holes of an appropriate shape (for example, approximately 0.2 mm in diameter in this preferred embodiment) on the insulating sheets 23 to 26 using a mold, laser, or other suitable device, and filling the holes with a conductive material such as Ag, Pd, Cu, Ni, Au, and Ag—Pd, or other suitable material.

The internal ground patterns 36 and 37 are disposed on the left and right sides of the sheet 23, respectively. One end of the internal ground pattern 36 is exposed at the left end of the sheet 23, and one end of the internal ground pattern 37 is exposed at the right end of the sheet 23.

The bridge pattern 35, having a constant width, is arranged to extend from the left end of the insulating sheet 25 to the right end thereof through the proximity of the inductor via holes 30c and 31c. One end of the bridge pattern 35 is exposed at the left end of the sheet 25 and the other end thereof is exposed at the right end of the sheet 25. The width of the bridge pattern 35 is preferably about 50 $\mu$m to about 300 $\mu$m. If the bridge pattern is too narrow, the value of the magnetic coupling will vary, whereas if it is too wide, the magnetic flux will be shielded.

The insulating sheets 24 and 26 are adjusting sheets for changing the position of the bridge pattern 35 in the lamination direction. By appropriately increasing or decreasing the thicknesses of the insulating sheets 24 and 26, the bridge pattern 35 can be placed at a desired position in the axial direction of the columnar inductors L1 and L2. Thus, by adjusting the thicknesses of the insulating sheets 24 and 26, the inductance values of the inductors L1 and L2, defined primarily of the inductor via holes, can also be adjusted. In order to provide a desired thickness for each of the insulating sheets 24 and 26, a single relatively thick sheet or a plurality of relatively thin sheets may be used.

The hot-side capacitor patterns 33 and 34 are disposed on the left and right sides of the sheet 27, respectively. One end of the hot-side capacitor pattern 33 is exposed at the rear end of the sheet 27, and one end of the hot-side capacitor pattern 34 is exposed at the front end of the sheet 27. The ground-side capacitor pattern 38 is disposed on the sheet 28. The lead portions of the ground-side capacitor pattern 38 are exposed at the right end and left end of the sheet 28. The hot-side capacitor patterns 33 and 34 face the ground-side capacitor pattern 38 via the insulating sheet 27, defining the capacitors C1 and C2, respectively.

The hot-side capacitor pattern 33 is connected to one end of the inductor L1 (i.e., the via hole 30d), such that the inductor L1 and the capacitor C1 define an LC resonator Q1. The hot-side capacitor pattern 34 is connected to one end of the inductor L2 (i.e., the via hole 31d), such that the inductor L2 and the capacitor C2 define an LC resonator Q2.

The sheets 22 to 28 are laminated in the order shown in FIG. 1, and are integrally fired, whereby a laminated body 40 (having approximate dimensions, for example, of 3.2 mm in length, 1.6 mm in width, and 1.2 mm in thickness) shown in FIGS. 2 and 3 is produced. On the rear and front side surfaces of the laminated body 40, an input terminal 41 and an output terminal 42 are provided, respectively, and on the left and right side surfaces thereof, external ground electrodes G1 and G2 are disposed, respectively. The input terminal 41 is connected to the hot-side capacitor pattern 33, and the output terminal 42 is connected to the hot-side capacitor pattern 34. The external ground electrode G1 is connected to one end of the internal ground pattern 36, one end of the bridge pattern 35, and one end of the ground-side capacitor pattern 38. The external ground electrode G2 is connected to one end of the internal ground pattern 37, the other end of the bridge pattern 35, and the other end of the ground-side capacitor pattern 38.

Figure 4:
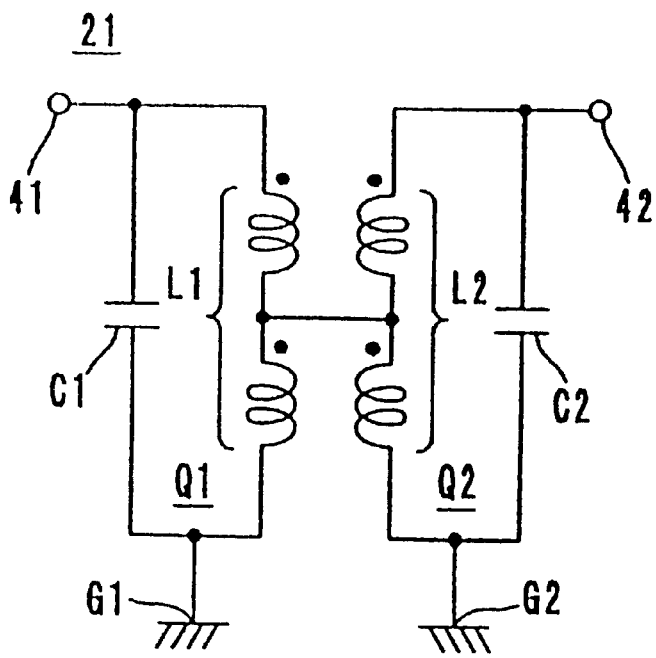
FIG. 4 is an equivalent electric circuit diagram of the multilayered LC filter shown in FIG. 2.

FIG. 4 is an equivalent electrical circuit diagram of the multilayered LC filter 21 described above. The resonators Q1 and Q2 are magnetically coupled via the bridge pattern 35, constituting a two-stage filter. One end of each of the inductors L1 and L2 of the resonators Q1 and Q2 (i.e., the via holes 30d and 31d) is connected to one end of the capacitors C1 and C2, respectively. The other ends of the inductors L1 and L2 (i.e., the via holes 30a and 31a) are electrically connected to the internal ground patterns 36 and 37, respectively.

In the multilayered LC filter 21, one end of each of the inductors L1 and L2 is electrically connected to the external ground electrodes G1 and G2, provided on the surface of the laminated body 40, via the internal ground patterns 36 and 37, respectively, the external ground electrodes G1 and G2 being electrically connected via the bridge pattern 35 disposed in proximity to the inductors L1 and L2. Thus, the value of the equivalent magnetic coupling between the LC resonators Q1 and Q2 can be adjusted by changing the position of the bridge pattern 35 without changing the size of the filter.

Figure 8:
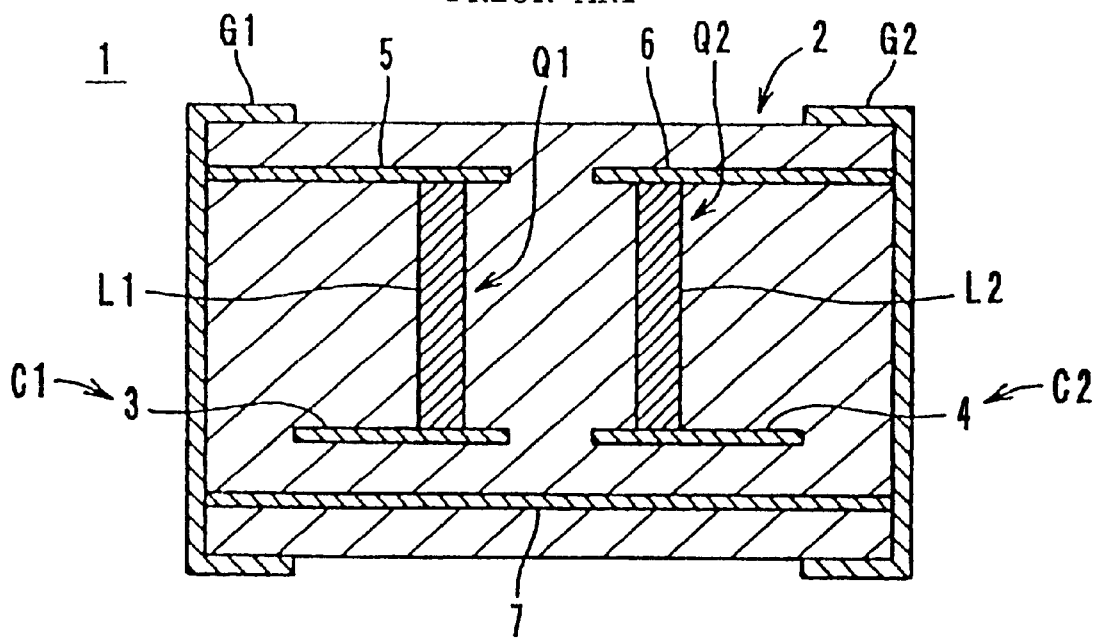
FIG. 8 is a sectional view of a conventional multilayered LC filter.
Figure 9:
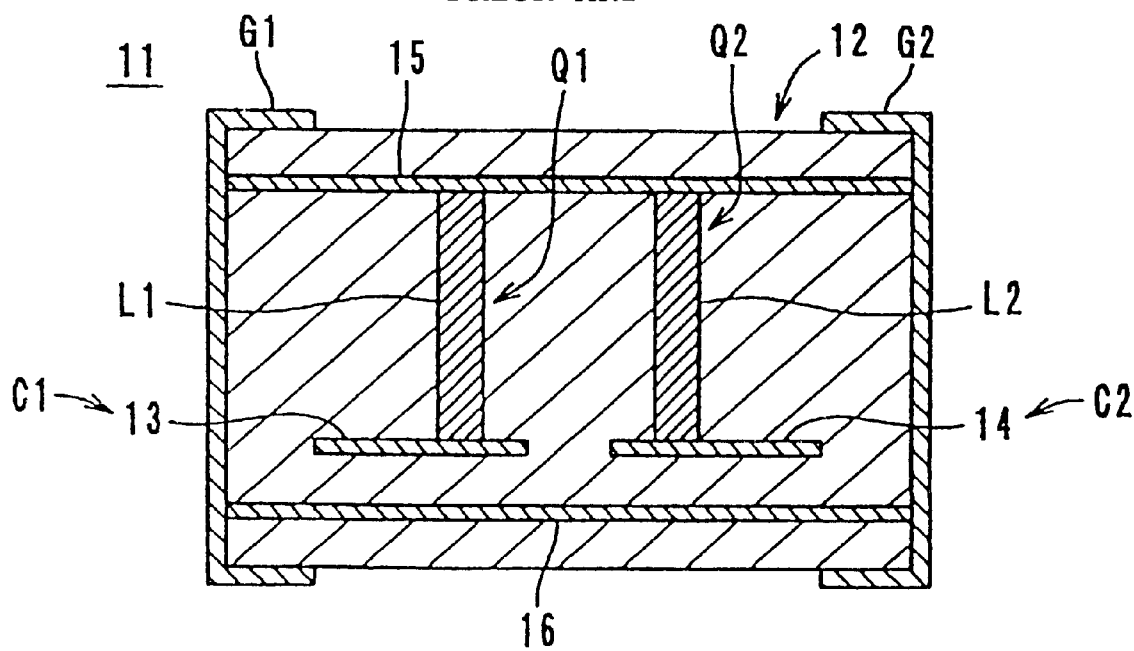
FIG. 9 is a sectional view of another conventional multilayered LC filter.

If the bridge pattern 35 is disposed at the lower ends of the inductors L1 and L2 in the lamination direction of the insulating sheets 22 to 28 (i.e., at the via holes 30d and 31d), the multilayered LC filter 21 becomes functionally equivalent to the conventional multilayered LC filter 1 shown in FIG. 8, the LC resonators Q1 and Q2 being capacitively coupled and the value of the magnetic coupling between the LC resonators Q1 and Q2 being approximately 0.1. If the bridge pattern 35 is disposed at the upper ends of the inductors L1 and L2 (i.e., at the via holes 30a and 31a), the multilayered LC filter 21 becomes functionally equivalent to the conventional multilayered LC filter 11 shown in FIG. 9, the LC resonators Q1 and Q2 being inductively coupled and the value of the magnetic coupling between the LC resonators Q1 and Q2 being approximately 0.2. If the bridge pattern 35 is disposed between the ends of each of the inductors L1 and L2, the value of the magnetic coupling between the LC resonators Q1 and Q2 becomes greater than about 0.1 and less than about 0.2. That is, the value of the magnetic coupling becomes smaller than in the case where the LC resonators Q1 and Q2 are inductively coupled, and larger than in the case where the LC resonators Q1 and Q2 are capacitively coupled.

Furthermore, because the external ground electrodes G1 and G2 are electrically connected via the bridge pattern 35, the value of magnetic coupling between the LC resonators L1 and L2 can be selected as desired while maintaining a sufficient distance between the columnar inductors L1 and L2. For example, in the present preferred embodiment, the distance between the columnar inductors L1 and L2 may be as large as about 300 µm or even larger, preventing problems in manufacturing, for example, the ceramic body between the inductors L1 and L2 cracking at the time of firing due to the inductors L1 and L2 being disposed too close to each other.

Figure 5:
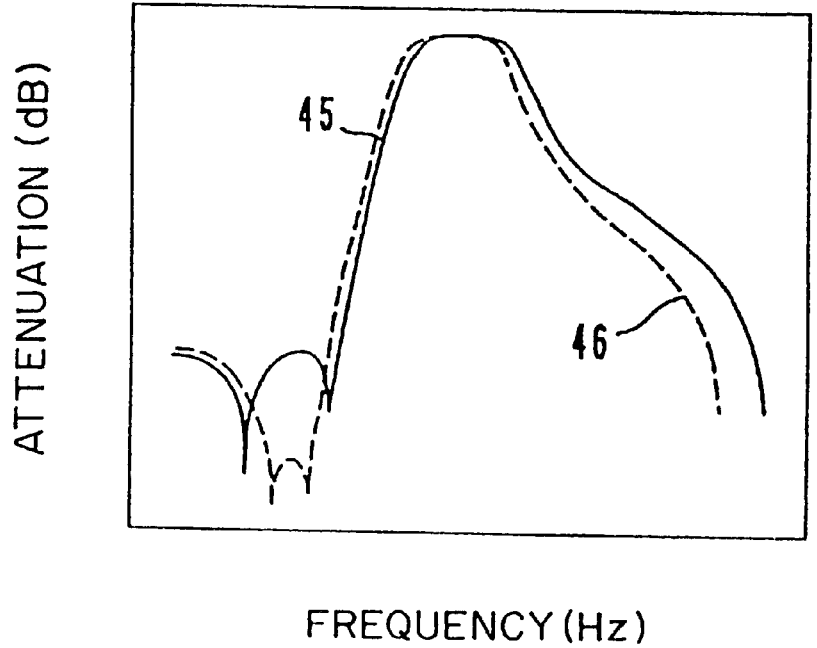
FIG. 5 is a graph showing the frequency characteristics of the multilayered LC filter shown in FIG. 2.

The multilayered LC filter 21 described above exhibits very favorable characteristics. FIG. 5 is a graph showing the attenuation characteristics of the multilayered LC filter 21. As the bridge pattern 35 is moved towards the hot-side capacitor patterns 33 and 34, the attenuation characteristics change from those indicated by the solid line 45 to those indicated by the dotted line 46.

The present invention is not limited to the above-described preferred embodiments, and various modifications can be made within the gist thereof.

Although, in the above-described preferred embodiments, the value of the equivalent magnetic coupling between the LC resonators is adjusted by changing the position of the bridge pattern in the lamination direction of the laminated body (alternatively, the direction may be substantially perpendicular to the lamination direction of the laminated body), the value of the magnetic coupling may be adjusted by changing the width or thickness of the bridge pattern. If the width or thickness of the bridge pattern is decreased, the value of the magnetic coupling becomes larger. Conversely, if the width or thickness is increased, the value of the magnetic coupling becomes smaller.

The value of magnetic coupling may also be adjusted by changing the number of insulating sheets on which bridge patterns are provided. If the number of the insulating sheets is increased, the value of the magnetic coupling becomes smaller. Conversely, if the number of the insulating sheets is decreased, the value of the magnetic coupling becomes larger.

Figure 6:
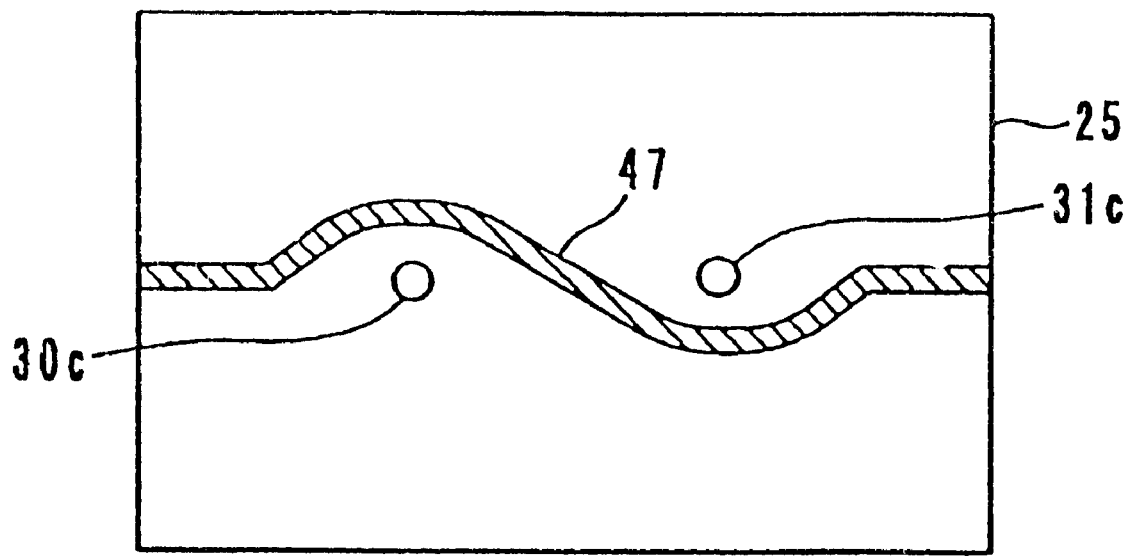
FIG. 6 is a plan view showing a modification of the bridge pattern.
Figure 7:
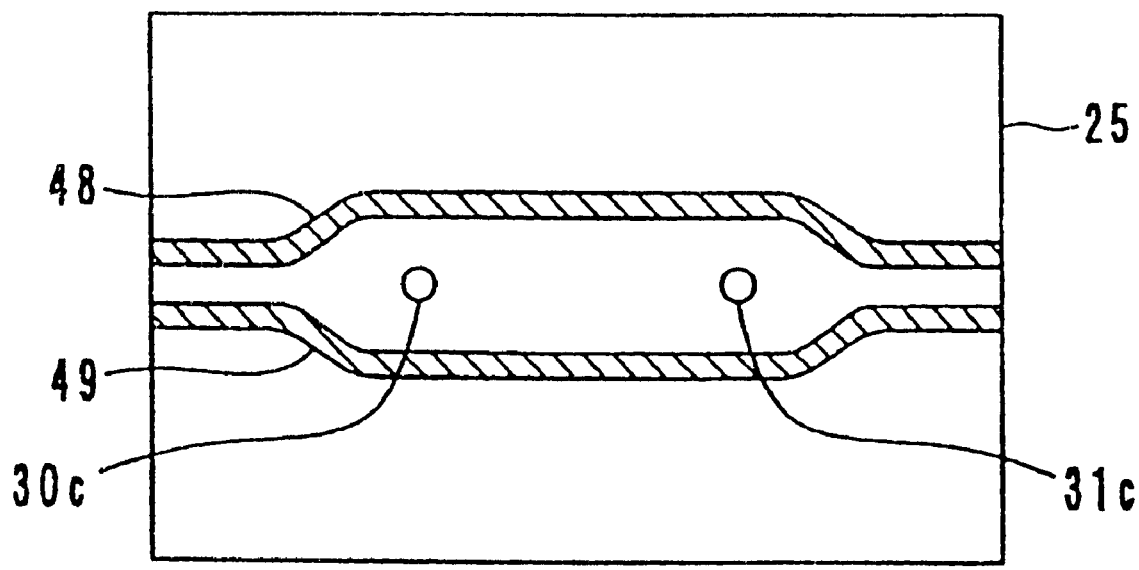
FIG. 7 is a plan view showing another modification of the bridge pattern.

Alternatively, a bridge pattern 47 disposed between the inductor via holes 30c and 31c, as shown in FIG. 6, or two bridge patterns 48 and 49 provided on the same insulating sheet 25, as shown in FIG. 7, may be used.

Furthermore, although, in the above-described preferred embodiments, the insulating sheets are integrally fired after the conductor patterns and via holes are formed thereon, the present invention is not limited thereto. Alternatively, pre-fired insulating sheets may be used. Furthermore, the following method may be used to manufacture a multilayered LC filter. First, an insulating layer of an insulating paste material is formed, for example, by printing. Then, conductor patterns and via holes are formed by applying a conductive paste material on the surface of the insulating layer. Then, the insulating paste material is applied thereover to form another insulating layer. Similar steps are performed, whereby a multilayered LC filter is manufactured.

While the present invention has been particularly shown and described with reference to preferred embodiments thereof, it will be understood by those skilled in the art that the foregoing and other changes in form and details can be made without departing from the spirit and scope of the invention.

What is claimed is:

1. A multi-layered LC filter comprising:
    a laminated body including a plurality of insulating layers laminated together in a lamination direction;
    a plurality of LC resonators including a plurality of inductors and a plurality of capacitors provided in the laminated body, said plurality of inductors including a plurality of via holes connected to each other in the lamination direction of said plurality of insulating layers;
    a plurality of external ground electrodes provided on a surface of said laminated body, to which ends of said plurality of inductors are electrically connected individually; and
    a bridge pattern disposed on a surface of one of said plurality of insulating layers and in proximity to said plurality of inductors so as to electrically connect said plurality of external ground electrodes, said bridge pattern is disposed inside of the laminated body and arranged so as to be opposed to and spaced from said plurality of via holes of the inductors via a portion of said one of said plurality of insulating layers.

2. A multi-layered LC filter according to claim 1, wherein the plurality of via holes connected to each other in the lamination direction of said plurality of insulating layers comprise columnar inductors having a length of about $\lambda/4$, wherein $\lambda$ is the wavelength at the center frequency of the filter.

3. A multi-layered LC filter according to claim 1, wherein the plurality of via holes connected to each other in the lamination direction are filled with one of Ag, Pd, Cu, Ni, Au, and Ag—Pd.

4. A multi-layered LC filter according to claim 1, wherein the plurality of LC resonators are magnetically coupled via the bridge pattern to define a two stage filter.

5. The multi-layered LC filter according to claim 1, wherein said bridge pattern is disposed between the ends of each of said plurality of inductors in the lamination direction of said plurality of insulating layers.

6. The multi-layered LC filter according to claim 1, wherein said plurality of LC resonators include a magnetic coupling therebetween such that the value of said magnetic coupling between said plurality of LC resonators is less than if said plurality of LC resonators were inductively coupled, and greater than if said plurality of LC resonators were capacitively coupled.

7. The multi-layered LC filter according to claim 6, wherein the value of the magnetic coupling between said plurality of LC resonators is larger than about 0.1 and smaller than about 0.2.

8. The multi-layered LC filter according to claim 1, further comprising segmented internal ground patterns provided on one of the plurality of insulating layers.

9. The multi-layered LC filter according to claim 1, wherein the plurality of the inductor via holes and the bridge pattern located in proximity to said plurality of inductor via holes are provided on one of the plurality of insulating layers.

10. The multi-layered LC filter according to claim 1, further comprising a plurality of hot-side capacitor patterns provided on one of the plurality of insulating layers.

11. The multi-layered LC filter according to claim 10, further comprising a ground-side capacitor pattern provided on another of the plurality of insulating layers and arranged to oppose said plurality of hot-side capacitor patterns, such that said plurality of capacitors of said plurality of LC resonators are defined.

12. A multi-layered LC filter comprising:
    a laminated body including a plurality of insulating layers laminated together in a laminating direction;
    a plurality of LC resonators including a plurality of inductors and a plurality of capacitors provided in the laminated body;
    segmented internal ground patterns provided on a first of the plurality of insulating layers;
    a first plurality of inductor via holes and a bridge pattern located in proximity to said first plurality of inductor via holes, the first plurality of via holes and the bridge pattern being provided on a second of the plurality of insulating layers;
    a second plurality of via holes provided on a third of the plurality of insulating layers;
    a plurality of hot-side capacitor patterns provided on a fourth of the plurality of insulating layers;
    a ground-side capacitor pattern provided on a fifth of the plurality of insulating layers and arranged to oppose said plurality of hot-side capacitor patterns, such that said plurality of capacitors of said plurality of LC resonators are defined;
    an external input electrode, an external output electrode, and a plurality of external ground electrodes provided on a surface of said laminated body which includes said first to fifth insulating layers;
    wherein said first plurality of inductor via holes provided on said second insulating layer and said second plurality of inductor via holes provided on said third insulating layer are connected to each other in the lamination direction of said plurality of insulating layers, first ends of said plurality of inductors are electrically connected to said plurality of hot-side capacitor patterns of said plurality of capacitors, second ends of said plurality of inductors are electrically connected to said plurality of external ground electrodes via said internal ground patterns provided on said first insulating layer, the ends of said bridge pattern provided on said second insulating layer are electrically connected respectively to said plurality of external ground electrodes, and said bridge pattern is disposed in proximity to said plurality of inductors including said plurality of via holes.

13. A multi-layered LC filter according to claim 12, wherein the first and second plurality of via holes are respectively connected to each other in the lamination direction of said plurality of insulating layers and comprise columnar inductors having a length of about $\lambda/4$, wherein $\lambda$ is the wavelength at the center frequency of the filter.

14. A multi-layered LC filter according to claim 12, wherein the first and second plurality of via holes are filled with one of Ag, Pd, Cu, Ni, Au, and Ag—Pd.

15. A multi-layered LC filter according to claim 12, wherein the plurality of LC resonators are magnetically coupled via the bridge pattern to define a two stage filter.

16. The multi-layered LC filter according to claim 12, wherein said bridge pattern is disposed between the ends of each of said plurality of inductors in the lamination direction of said plurality of insulating layers.

17. The multi-layered LC filter according to claim 12, wherein said plurality of LC resonators include a magnetic coupling therebetween such that the value of said magnetic coupling between said plurality of LC resonators is less than if said plurality of LC resonators were inductively coupled, and greater than if said plurality of LC resonators were capacitively coupled.

18. The multi-layered LC filter according to claim 17, wherein the value of the magnetic coupling between said plurality of LC resonators is larger than about 0.1 and smaller than about 0.2.

19. The multi-layered LC filter according to claim 1, wherein said bridge pattern is disposed inside of the laminated body at an approximate central location thereof.

20. The multi-layered LC filter according to claim 1, wherein said plurality of via holes of said plurality of inductors are connected between an internal ground pattern and a hot-side capacitor pattern, and the bridge pattern is arranged between the internal ground pattern and the hot-side capacitor pattern in the lamination direction.

* * * * *